US009728667B1

(12) United States Patent
Johnson et al.

(10) Patent No.: US 9,728,667 B1
(45) Date of Patent: Aug. 8, 2017

(54) SOLID STATE PHOTOMULTIPLIER USING BURIED P-N JUNCTION

(71) Applicant: Radiation Monitoring Devices, Inc., Watertown, MA (US)

(72) Inventors: Erik Bjorn Johnson, Auburn, MA (US); Xiao Jie Chen, Ashland, MA (US); Chad Whitney, Waltham, MA (US); Christopher Stapels, Mills, MA (US); James F. Christian, Waltham, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 15/048,246

(22) Filed: Feb. 19, 2016

Related U.S. Application Data

(63) Continuation of application No. 13/656,089, filed on Oct. 19, 2012, now abandoned.

(60) Provisional application No. 61/549,958, filed on Oct. 21, 2011.

(51) Int. Cl.
| | |
|---|---|
| *H01L 31/00* | (2006.01) |
| *H01L 31/107* | (2006.01) |
| *H01L 31/02* | (2006.01) |
| *H01L 27/06* | (2006.01) |
| *H01L 27/144* | (2006.01) |
| *H01L 27/146* | (2006.01) |

(52) U.S. Cl.
CPC ...... *H01L 31/1075* (2013.01); *H01L 27/0629* (2013.01); *H01L 27/1446* (2013.01); *H01L 27/14609* (2013.01); *H01L 31/02027* (2013.01)

(58) Field of Classification Search
CPC .............. H01L 31/1075; H01L 27/0629; H01L 27/1446; H01L 27/14609; H01L 31/02027
USPC ................ 257/291, 292, 438, 443, 448, 461, 257/E27.129, E27.132, E27.133, E31.116
See application file for complete search history.

(56) References Cited

U.S. PATENT DOCUMENTS 6,049,118 A * 4/2000 Nagano ............. H01L 31/02024
257/187
2010/0271108 A1* 10/2010 Sanfilippo ....... H01L 31/022416
327/502

* cited by examiner

*Primary Examiner* — Hung Vu
(74) *Attorney, Agent, or Firm* — Wolf, Greenfield & Sacks, P.C.

(57) ABSTRACT

A device that detects single optical and radiation events and that provides improved blue detection efficiency and lower dark currents than prior silicon SSPM devices. The sensing element of the devices is a photodiode that may be used to provide single photon detection through the process of generating a self-sustained avalanche. The type of diode is called a Geiger photodiode or signal photon-counting avalanche diode. A CMOS photodiode can be fabricated using a "buried" doping layer for the P-N junction, where the high doping concentration and P-N junction is deep beneath the surface, and the doping concentration at the surface of the diode may be low. The use of a buried layer with a high doping concentration compared to the near surface layer of the primary P-N junction allows for the electric field of the depletion region to extend up near the surface of the diode. With a low doping concentration through the bulk of the diode, the induced bulk defects are limited, which may reduce the dark current. The resulting structure provides a diode with improved quantum efficiency and dark current.

17 Claims, 7 Drawing Sheets

SOLID STATE PHOTOMULTIPLIER USING BURIED P-N JUNCTION

CROSS-REFERENCE TO RELATED APPLICATIONS

This application is a continuation of U.S. application Ser. No. 13/656,089, filed Oct. 19, 2012, which claims priority under 35 U.S.C. 119(e) to U.S. Provisional Application No. 61/549,958, filed Oct. 21, 2011, which are hereby incorporated by reference in their entirety.

BACKGROUND

1. Technical Field

Described herein is a photodiode having a buried P-N junction. The photodiode may be used in a solid-state photomultiplier that can detect optical or radiation events.

2. Discussion of the Related Art

Photomultiplier tubes (PMTs) are a standard technology for detecting small light pulses. The photomultiplier tube is a vacuum tube technology that uses a photocathode, dynodes, and an anode. PMTs provide excellent performance characteristics in that they have a large gain ($\sim 10^6$) and have a good quantum efficiency over the spectral range determined by the photocathode material. PMTs are limited in that they are bulky, require high voltage, and are susceptible to large magnetic fields and helium, for example.

Silicon avalanche photodiodes (APDs) are an alternative to PMTs in low-light applications that can have a compact size, high quantum efficiency, insensitivity to magnetic fields and the possibility of mass-production using planar processing. Very large area APDs (40 cm$^2$) as well as monolithic APD arrays (28×28 elements, 0.8-mm pixels) have been fabricated at Radiation Monitoring Devices (RMD), of Watertown, Mass., using a planar process. APD arrays are also being manufactured by other vendors such as Perkin-Elmer, of Waltham, Mass., and Hamamatsu, of Hamamatsu, Japan.

The APDs do, however, have some performance limitations. In particular, the gain of most APD designs is not very high. The APDs manufactured by Hamamatsu and Perkin Elmer with reach-through designs exhibit gains in the range of 50-100. The gain of deep-diffused APDs manufactured by RMD is higher (~1000 or more). These gain values are lower than those for PMTs (with gain $\sim 10^6$), and additional circuitry may be needed, such as a relatively low-noise pre-amplifier, to achieve a high signal-to-noise ratio though the use of APDs. Another disadvantage is that the temporal response of most APD designs is also not as fast as that of high-end PMTs. While APDs are promising devices and are playing an important role in low-light applications, alternative silicon based photodetectors (such as the proposed solid-state photomultipliers) are also promising as they provide a gain comparable to PMTs, very high timing resolution and compact size.

The Geiger photodiode (GPD), also termed a single photon counting diode, is based on the avalanche photo-diode with a different mode of operation. The response of the GPD is binary for an incident photon with a large gain ($\sim 10^6$) proportional to the diode junction capacitance and the bias above breakdown. The signal response of each GPD is independent of the number of incident photons, and the probability to generate a self-sustained avalanche is dependent on the bias above breakdown. Once the avalanche is induced either thermally or optically, the diode discharges, creating a sizable current. If a ballast resistor is used in series with the GPD, the self-sustained avalanche can be quenched as the voltage drop across the resistor reduces the bias across the diode to the breakdown voltage. The diode will then recharge and wait for the next avalanche event. The table below provides a brief history of the development of the Geiger photodiodes, and the integration of these diodes for fabrication of solid-state photomultipliers.

| Year | Development |
|---|---|
| 1973 | McIntyre predicts Geiger-mode operation for APDs operated above their reverse bias breakdown voltage. |
| 1985 | McIntyre experimentally validates operation of Geiger-mode APDs. The electric field in the device enables the operation of APD devices above their reverse bias breakdown voltage. |
| 1993 | RMD reports on the fabrication of Geiger-mode APDs (GPDs). Reducing the size of the APD decreases the amplitude of the thermal signal, producing lower DCR in GPD devices. |
| 1996 | Cova et al. reports on the single photon avalanche diode response function in relation to fabricated devices in a silicon process. |
| 2001 | Buzhan et al. report on the fabrication of an SiPM using the MRS process. The integration of resistors in the MRS process enables the fabrication of large arrays with two readout contacts. |
| 2004 | RMD reports on the migration GPD pixels to a commercial CMOS process. The use of commercial CMOS process facilitates the integration of circuit components, and the use of an available multi-user service substantially reduces the development cost and time. |

The solid-state photomultiplier (SSPM) is built from an array of Geiger photodiodes (GPDs). If the GPDs are placed in an array and read out in parallel, the result provides a two-terminal photodetector, where the signal is proportional to the number of GPDs triggered and the incident light intensity. Since the 1970s, solid-state (silicon) photomultipliers have been in development, and by 2001, fabrication of MRS (metal-resistor semiconductor) SSPMs was successful. CMOS (complementary metal-oxide semiconductor) devices were soon to follow. A number of instruments for the medical, scientific, and defense fields are being developed using SSPMs. Broad device characteristic studies have been made discussing the response of SSPMs for detection efficiency and noise terms (cross talk, after pulsing, and dark counts).

When operating the GPD pixel, the detection efficiency (DE) is proportional to the probability of creating a Geiger avalanche, or Geiger probability. The Geiger probability is related to the electric field within a GPD, which is typically very high. The probability is roughly linearly related to the bias above the breakdown voltage until a 100% Geiger probability is reached. The detection efficiency refers to the overall product of the photon absorption, charge collection, and generation of a self-sustained avalanche, i.e., the ratio of detected photons to incident photons.

The three typical noise sources attributed to SSPMs arise from dark counts, cross talk, and after pulsing. Noise from dark counts, or thermally induced Geiger events, is analogous to dark current in conventional solid-state detectors. The contribution of noise from dark counts is expected to scale with the active area of the SSPM detector. The second significant noise term arises from statistical fluctuations in the optical cross talk between pixels in the SSPM. The Geiger discharge from the GPD pixels in the SSPM produces hot carrier emission of photons from the diode, which may cause cross talk between pixels. The third source of noise in the SSPM arises from the statistical fluctuations associated with after pulsing. The avalanche process creates an ensemble of charge across the diode junction, some of which will populate traps in the silicon. As these traps are liberated, the pixel may avalanche again, yielding another pulse (after pulse). Since there is a probability associated with the occurrence of an after pulse, these pulses add to the parallel noise of the device when integrating the signal.

As the proportional response is provided by the number of pixels triggered in the SSPM, there is an upper bound in the SSPM response, since a GPD can trigger once for integration times on the scale of the GPD recharge time. A nonlinear response function developed for SSPMs can be used to understand the effects on the energy resolution as the number of triggered pixels approaches the number of available pixels.

DETAILED DESCRIPTION

Described herein is a photodiode having a buried semiconductor layer of a high doping concentration, according to some embodiments. The photodiode may be operated as a Geiger photodiode, such that it is reverse biased above its breakdown voltage. An array of such photodiodes can be used to form a solid state photomultiplier (SSPM) that detects electromagnetic radiation. A radiation detector can be produced that includes a scintillator material and a SSPM. The SSPM can detect light produced by the scintillator material in response to incident radiation, including ionizing and non-ionizing radiation. The photodiode described herein may be used for photodetection or for detection of any phenomenon that may generate an electron-hole pair in the diode that may cause the diode to undergo a self-sustained avalanche.

Figure 1:
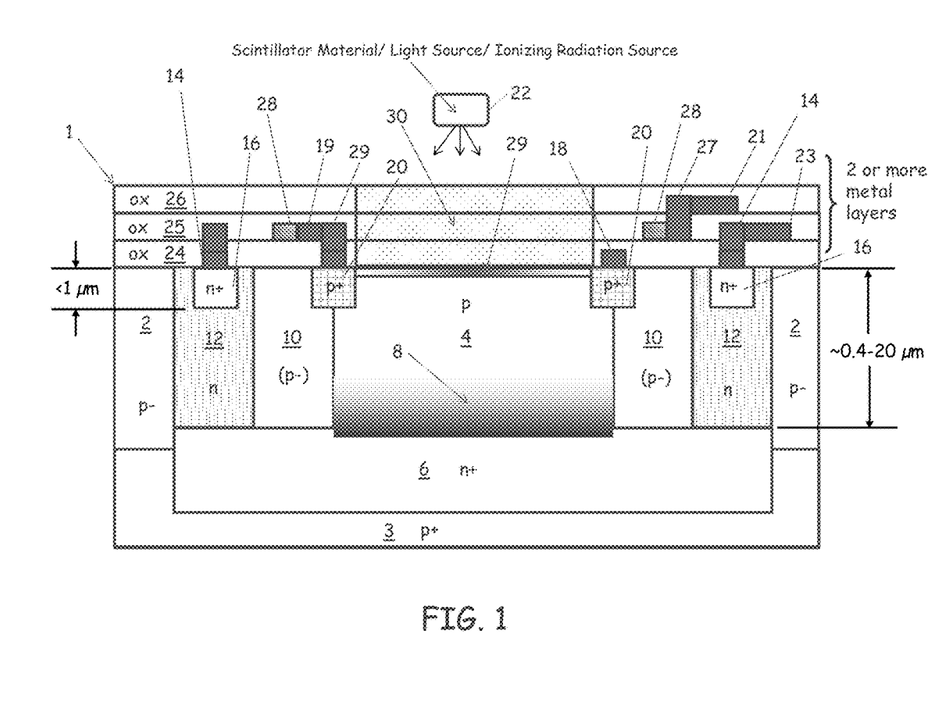
FIG. 1 shows a cross section of a photodiode structure having a buried layer, according to some embodiments.

FIG. 1 shows a cross section of a photodiode structure 1 having a buried layer, according to some embodiments. Also shown in FIG. 1 is a material 22 that may produce electromagnetic radiation in response to incident radiation. The electromagnetic radiation produced by material 22 may be detected using an array of photodiodes such as the photodiode illustrated in FIG. 1. In some embodiments, the source material 22 is considered a light source, a source of ionizing radiation, or a scintillation material.

Various scintillator materials are available which convert high energy incoming radiation, including particles or photons, into light having a wavelength within or near the visible range. The scintillator material may be suitable for detection of neutrons and/or X-rays, or any other suitable type of radiation, including heavy-ions, mesons, gamma rays, beta particles and alpha particles, for example. The scintillator material may have a crystalline structure or an amorphous structure. In some embodiments, the scintillator material may be packaged together with the semiconductor chip to produce an integrated radiation detector. Any suitable scintillator material may be used, examples of which include $Cs_2LiYCl_6$, $Cs_2LiYCl_6:Ce^{3+}$, $Cs_2LiYBr_6$, $Cs_2LiYBr_6:Ce$, $Cs_2LiYX_6:Ce^{3+}$ or $CsRbLiYX_6:Ce^{3+}$ where X is Br or Il, NaI(Ti), $Cs_2NaLaBr_6$, $Cs_2NaGdI_6$, $Cs_2NaLaI_6$, $Cs_2NaLuI_6$, $Cs_2LiLaF_6$, $Cs_2LiLaCl_6$, $Cs_2LiLaBr_6$, $Cs_2LiLaI_6$, Li glass, LiI doped with Eu, LiF+ZnS(Ag), Diphenylanthracene, Polyvinyl toluene, NaI, CsI, BGO, LSO, LYSO, $PbWO_4$, SrI, or Stilbene.

As shown in FIG. 1, photodiode structure 1 may be formed in an epitaxy 2 of semiconductor material. Epitaxy 2 may be formed on a low-resistance substrate 3. The epitaxy 2 or substrate 3 may be formed of silicon or any other suitable semiconductor material. As discussed below, regions of various doping concentrations are formed in the epitaxy 2.

Photodiode structure 1 may include a region 4 of a first conductivity type (e.g., p-type) and a buried region 6 of a second conductivity type (e.g., n-type) forming the p and n terminals, respectively, of a P-N junction diode. Region 4 may be formed at the upper surface of the epitaxy 2 and extending down to buried region 6. Buried region 6 contacts region 4, thereby forming a buried P-N junction 8 at the interface between buried region 6 and region 4. As shown in FIG. 1, buried region 6 may be formed underneath region 4, i.e., farther from the upper surface of the epitaxy 2. As an example, the upper surface of buried region 6 may be 0.4-20 µm from the upper surface of the semiconductor region 2. However, the buried layer 6 may be spaced apart from the upper surface of semiconductor region 2 by any suitable distance, as the techniques described herein are not limited to specific dimensions.

The buried region 6 may have a doping concentration higher than that of region 4. For example, in some embodiments, the buried region 6 may have a doping concentration of from $10^{18}$ to $10^{19}$ $cm^{-3}$ or greater. By doping buried region 6 to a higher doping concentration than that of the first region 4, the depletion region of the photodiode may extend farther into the first region 4 from the P-N junction 8 than it extends into the buried region 6. The depletion region thus extends primarily in an upward direction from the buried P-N junction 8 toward the surface of epitaxy 2.

Figure 2:
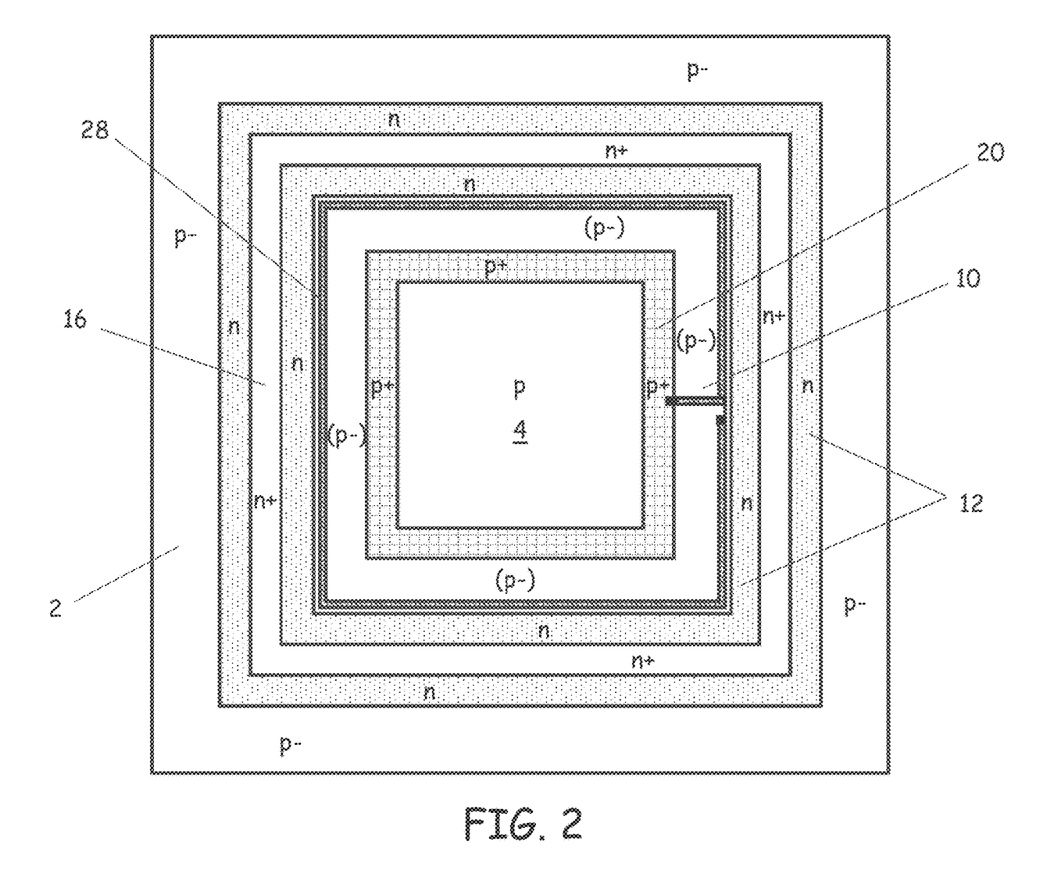
FIG. 2 shows the top view of the photodiode structure with the metal and oxide layers removed.

Side wall breakdown of the photodiode can be prevented by forming a guard ring encompassing region 10 and region 12, where region 10 is of the same conductivity type as region 4. Region 12 is of the same conductivity type as the buried region 6, but a different type than the epitaxy 2 and region 10. In some embodiments, region 10 may include a diffusion or implant that surrounds region 4. However, the guard ring formed from regions 10 and 12 may be formed in any suitable shape. For example, the outer edge of guard region 10 may have a rectangular shape (e.g., a square shape) as shown in FIG. 2. The drawing in FIG. 2 shows the regions of the diode structure that are included in the epitaxy 2, as the upper regions of oxide and metal are not drawn for clarity. In some embodiments, the region 10 may extend from the upper surface of the substrate 2 down to or near the buried layer 6. The region 12 extends from the surface down to the buried region 6, making an electrical connection to the buried region 6. The width of region 10 can be 0.1 µm or more, and the width of region 12 can be 0.1 µm or more. In some embodiments, region 12 may include multiple structures within region 12, having a doping concentration gradient that increases in concentration from the buried region 6 to the surface of epitaxy 2.

One or more electrical contacts 14 may be formed on the surface of region 12. Contact(s) 14 may be formed on a region 16 of high doping concentration to form an ohmic contact to region 12. Region 16 may have a width of no more than 50% of region 12 with a depth of less than 1 μm. Contacts 14 can be connected to through oxide vias to metal layers on top of possible oxides 24 or oxide 25. Similarly, one or more electrical contacts 18 may be formed on the surface of the intersection of regions 4 and 10. Contact(s) 18 may be formed on a region 20 of high doping concentration which may be no less than $10^{18}$ cm$^{-3}$ to form an ohmic contact to region 4 and 10. The width of region 20 may be greater than 0.2 μm, and region 20 is considered to be wide enough to provide sufficient conduction for both regions 4 and 10. Metal contacts 14, 29, and 18 may be no larger than the implant contact regions 16 and 20. In some cases, the width of the metal contact to the implant region is identical.

One possible embodiment of the photodiode may have a thin region 29, which is less than 0.1 μm in depth from the surface of epitaxy 2 and located within region 4. The region 29 has an electrical conductivity similar to region 4 and may be doped identical or higher than region 4.

Within some embodiments, an electrical connection of the diode is in series with a quenching resistor 28. This quenching resistor 28 is electrically connected at one end with a possible metal to polysilicon connection 19. The length and width of the resistor indicates the corresponding resistance. A resistance greater than 1 kΩ may be used for the quenching resistor 28. The trace shape for the quenching resistor 28 may be of any form (e.g., circular, zig-zag, or straight). The resistor may contact either side of the p-n junction. Through oxide vias 29, 14, and 27 are potentially used to isolate the read out trace for the anode and cathode of the diode. Techniques for readout are not confined to isolating the anode and cathode connections on separate metal layers within possible oxides 25 and 26. Any method for electrical connection is possible, as long as the diodes within the array are in parallel and the anode and cathode for all diodes in the array are electrically isolated. A final oxide 26 is used to protect the metal traces. The number of metal layers and thickness are only limited by the foundry process rules (i.e., more than 2 metal layers can be fabricated and used). In some cases, the width of the polysilicon resistors, metal traces, and connections are no less than 0.1 μm.

The region 30 within the top oxide layers 24, 25, and 26 indicates a region for optical conditioning of the photodiode in some embodiments. The region may be removed by an etching process, and the silicon surface may be treated to improve the optical quantum efficiency through the use of anti-reflective coatings or surface texturing. The area outside of region 30 may or may not include a metal fill at any of the metal layers above epitaxy 2.

Although FIG. 1 shows a photodiode structure 1 in which buried region 6 is an n-type region and region 4 is a p-type region, a photodiode may be formed in which these regions have the opposite conductivity type. For example, buried region 6 may be formed as a p-type region of a high doping concentration and region 4 may be formed as an n-type region, and the conductivity type of the other regions in substrate 2 may be reversed, as well. The doping concentration of region 4 may be different than region 10. In some embodiments, region 10 has a concentration of less than or equal to that of region 4. The differential charge distribution between the junction of regions 10 and 12 is lower than regions 4 and 6, providing a higher reverse bias breakdown voltage for the junction form from region 10 and 12 compared to the junction form from region 4 and 6. In some embodiments, region 4 may have any suitable doping concentration or concentration gradient such that the concentrations are not less than that of region 10.

A photodiode structure as shown in FIG. 1 was fabricated using a 0.18 μm high voltage CMOS process. The resulting photodiode shows a significant improvement in the performance characteristics compared to a conventional CMOS-based GPD design.

Figure 3:
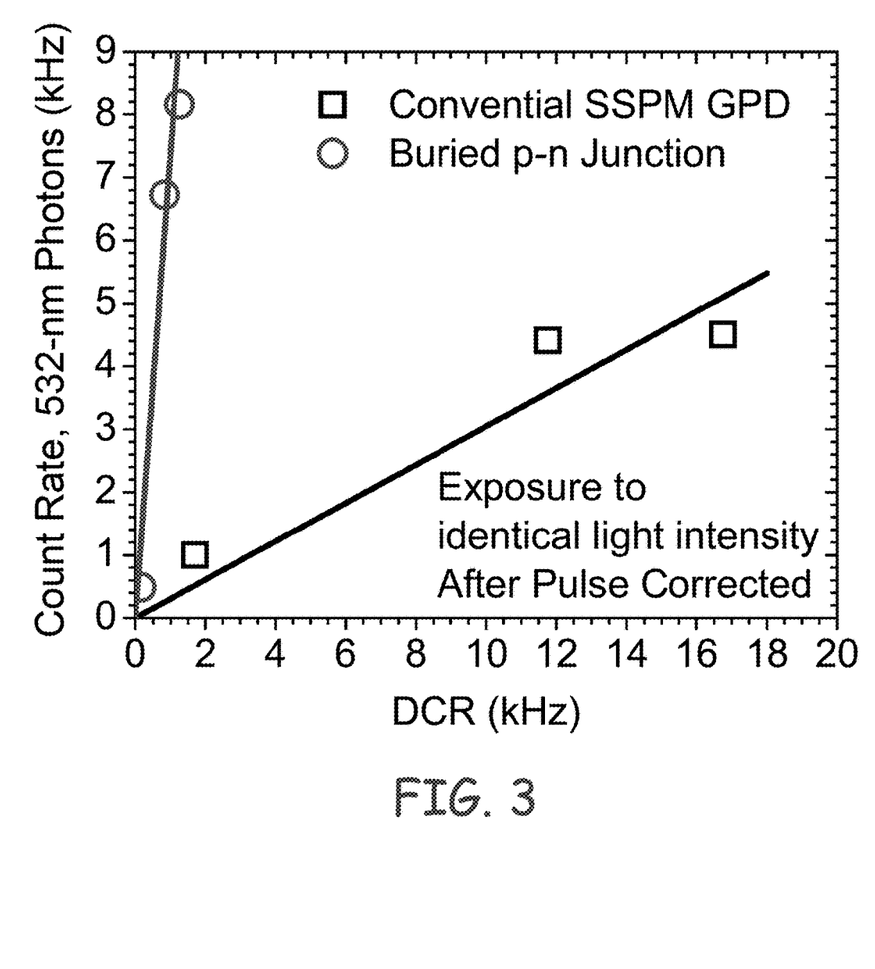
FIG. 3 shows a plot of the measured response with respect to the dark noise of the photodiode structure of FIG. 1 compared to that of a conventional SSPM GPD pixel.

FIG. 3 shows the count rate of the photodiode structure of FIG. 1 compared to a conventional SSPM GPD when exposed to the same light conditions. The count rate for the photodiode structure of FIG. 1 (Buried pn Junction) increases faster than the count rate for a conventional SSPM GPD as a function of the dark count rate. This is a strong indication that the detection efficiency of the photodiode structure of FIG. 1 has better signal to noise performance than the conventional SSPM GPD.

Figure 4:
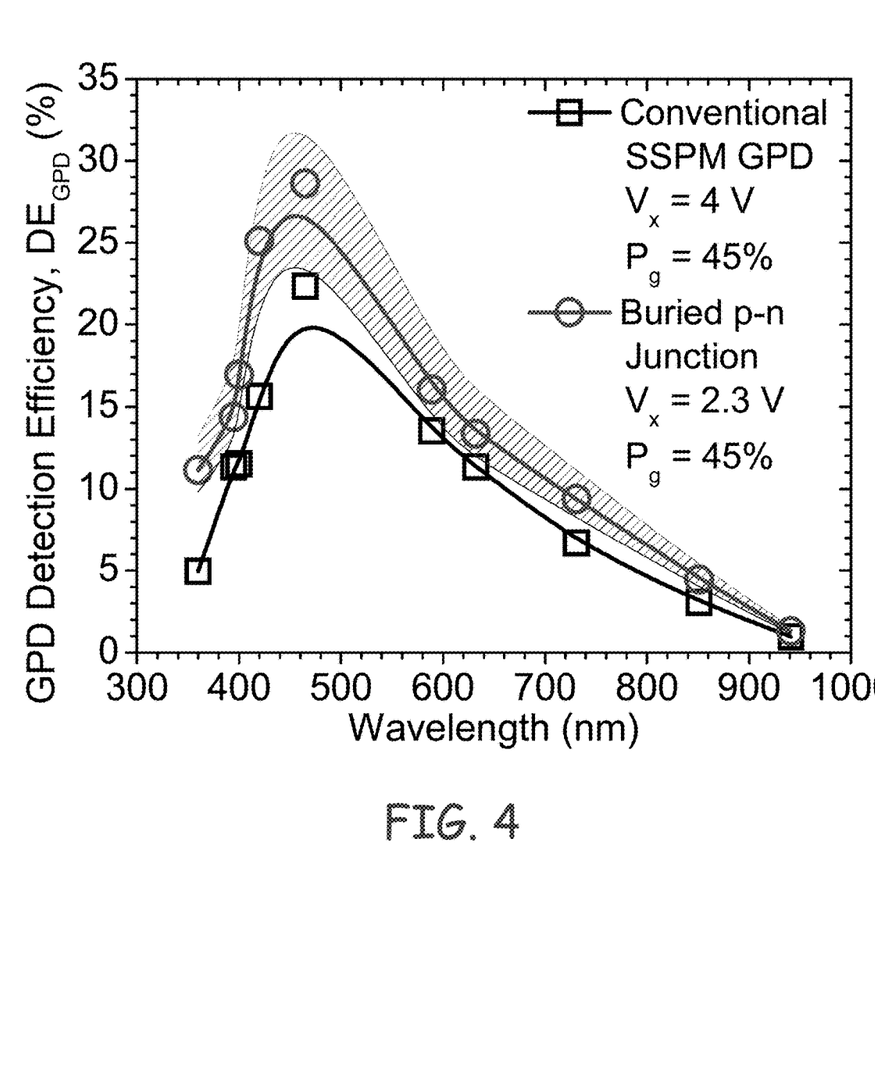
FIG. 4 shows plots of the efficiency of the photodiode of FIG. 1 versus wavelength compared to a conventional SSPM GPD pixel.

FIG. 4 shows a plot of the detection efficiency at approximately 45% Geiger probability, $P_g$, versus wavelength for the photodiode of FIG. 1 (Buried pn Junction) along with the detection efficiency from a conventional SSPM GPD. As shown in FIG. 4, the photodiode of FIG. 1 has excellent response to blue light, which enables the photodiode to operate effectively with state-of-the art scintillator materials.

Figure 5:
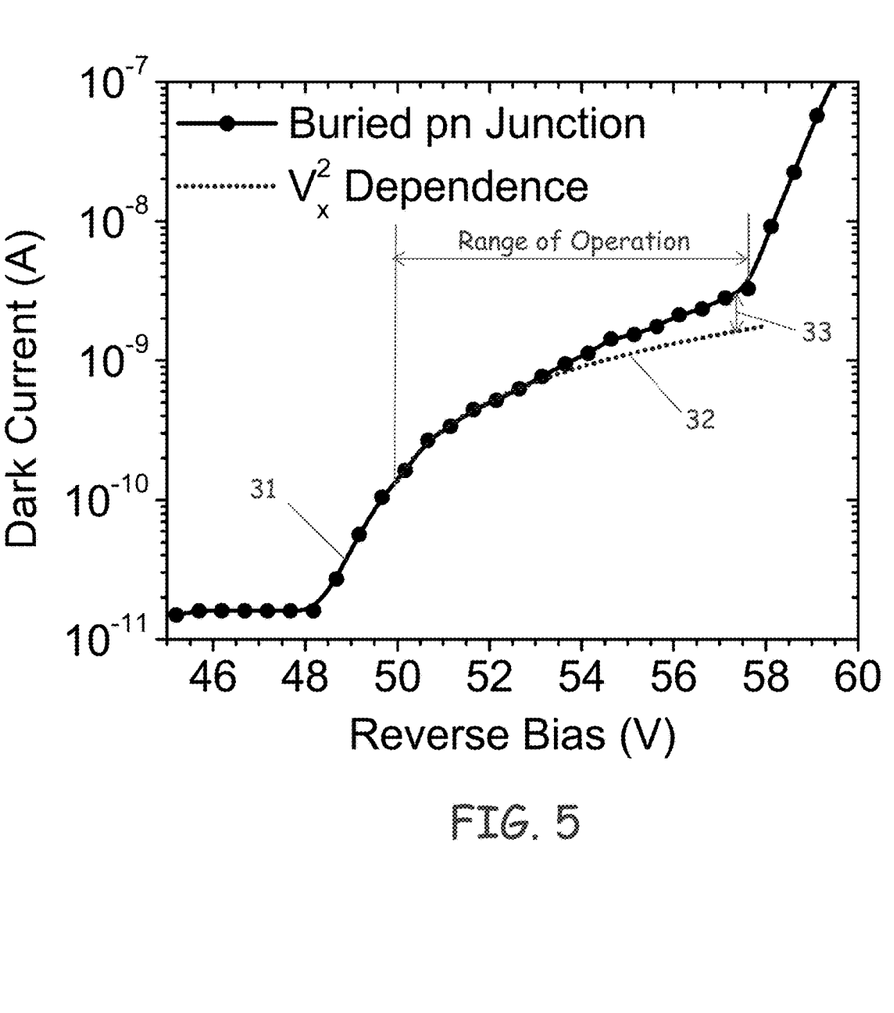
FIG. 5 shows a plot of the current versus voltage (IV) characteristic of the photodiode of FIG. 1 under reverse bias.

FIG. 5 shows a plot of the measured current versus voltage for the photodiode of FIG. 1, which shows Geiger behavior when the diode is placed in series with a quenching (ballast) resistor. The solid curve 31 shows the IV characteristics for a photodiode of FIG. 1. For comparison, dashed curve 32 shows a parabolic IV relationship.

There is a region of operation that spans the diode breakdown voltage and the point where the quenching circuit (resistor) fails. The voltage above breakdown is termed the excess bias or $V_x$. The expected response should follow a parabolic dependence and a deviation 33 above that dependence is related to excess charge generated in the diode. The excess charge has noise associated with it, and degrades the performance.

Figure 6A:
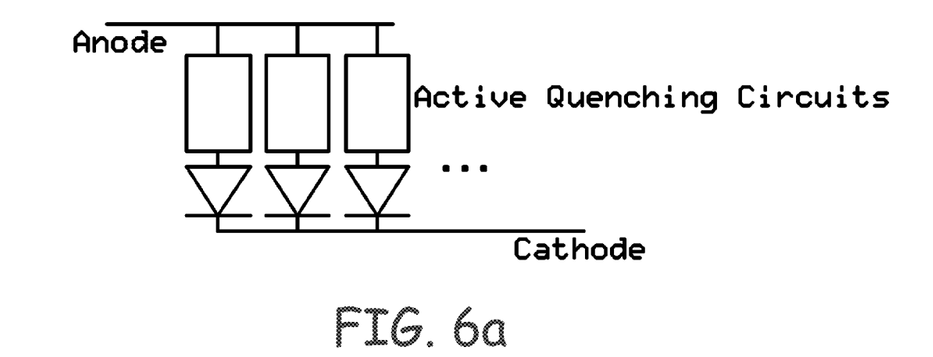
FIG. 6a and FIG. 6b show examples of readout arrangements for solid-state photomultipliers.
Figure 6B:
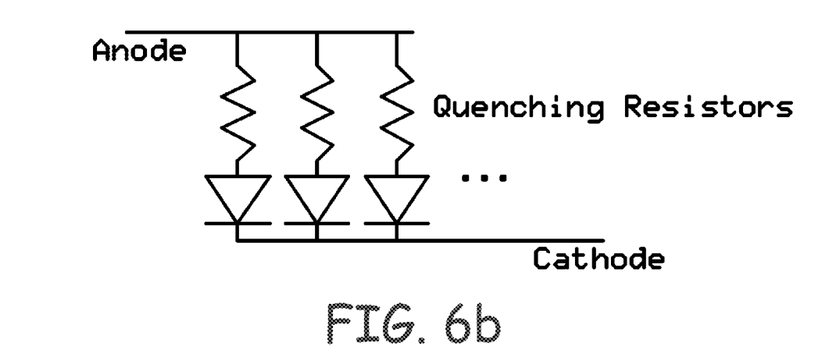

As discussed above, the Geiger photodiode of FIG. 1 may be a component of a solid-state photomultiplier having an array of such Geiger photodiodes formed on a semiconductor substrate. As shown in FIG. 6a and FIG. 6b, the SSPM can include a plurality of photodiodes in parallel, with each photodiode being in series with an active quenching circuit (FIG. 6a) or a passive quenching circuit (e.g., a quenching resistor, as shown in FIG. 6b). The distance of the diodes from FIG. 1 indicated by epitaxy 2 may come in direct contact with each other or be space at larger distances. The quenching circuit may be designed to sense the current draw from the diode and stop the self-sustained avalanche. The quenching circuits may also be formed on the same semiconductor substrate as the photodiode. A signal processing circuit may also be formed on the substrate to analyze the signals produced by the photodiode array. The array of photodiodes may be read out in parallel. The signal processing circuit may count the number of photodiodes triggered into avalanche by the reception of incident photons. The number of photodiodes triggered is proportional to light yield from the energy deposited from incident radiation striking the scintillator material 22, or for any pulse light source, the number of triggered diodes is proportional to the incident light intensity on the SSPM.

Figure 7:
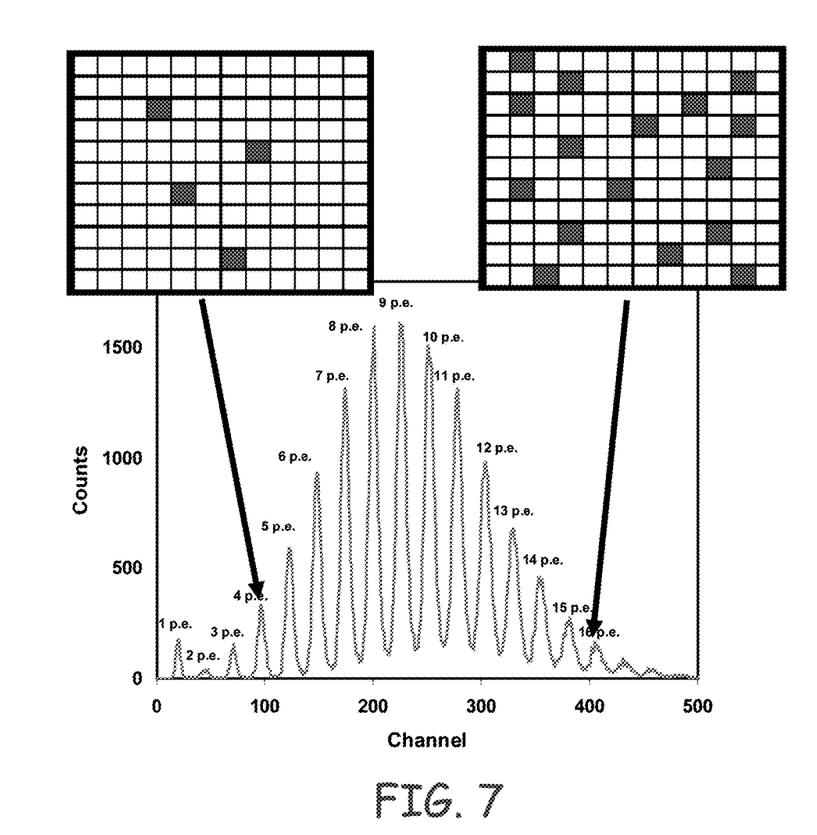
FIG. 7 shows a diagram of SSPM operation for low-light pulses.

FIG. 7 shows a diagram of the operation of the SSPM for low-light levels. The upper images illustrate arrays of Geiger photodiodes, and triggered diodes are highlighted. The bottom plot shows data from pulsed LED light on a small silicon SSPM. The term p.e. stands for photoelectrons. The number of diodes triggered is proportional to the signal from the SSPM indicated from the arrows to the fine structure in the bottom plot. The overall width of the distribution is associated with the statistics of the average number of photons detected over all light pulses.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A detector, comprising:
   an array of diodes formed in a semiconductor substrate, the array of diodes being configured to receive radiation from a radiation source through a first surface of the semiconductor substrate, the array of diodes comprising a first diode, the first diode having a first region of a first conductivity type and a buried region of a second conductivity type, wherein the buried region has a higher doping concentration than that of the first region, and wherein the buried region is positioned farther from the first surface of the semiconductor substrate than the first region is positioned,
   a guard region including two regions, an inner region and an outer region
   wherein the inner guard region has a conductivity type different from that of the outer guard region, wherein a conductivity type of the inner guard region is the same as that of the first region, and wherein the inner guard region is in contact with the first region and surrounds the first region.

2. The detector of claim 1, wherein the array of diodes includes a plurality of diodes connected in parallel.

3. The detector of claim 1, wherein the buried region is separated from the first surface of the semiconductor substrate.

4. The detector of claim 3, wherein the buried region is separated from the first surface of the semiconductor substrate by at least 0.4 microns.

5. The detector of claim 1, further comprising a second region of the second conductivity type that extends from the first surface to the buried region.

6. The detector of claim 1, wherein a conductivity type of the outer guard region is the same as that of the buried region.

7. The detector of claim 6, wherein the outer guard region surrounds and is in contact with the inner guard region forming a guard region junction.

8. The detector of claim 7, further comprising a contact that contacts the outer guard region.

9. The detector of claim 1, wherein the guard region surrounds the first region.

10. The detector of claim 1, further comprising a contact that contacts the inner guard region and the first region.

11. The detector of claim 1, wherein the guard region extends from the first surface to the buried region.

12. The detector of claim 1, wherein the buried region extends underneath the guard region.

13. The detector of claim 1, wherein the guard region junction has a higher breakdown voltage than a junction between the first region and the buried region.

14. The detector of claim 1, wherein the semiconductor substrate comprises an epitaxial region.

15. The detector of claim 1, wherein the array of diodes is fabricated using a silicon CMOS process.

16. The detector of claim 1, further comprising a quenching circuit configured to stop an avalanche process in the first diode.

17. The detector of claim 16, wherein the quenching circuit comprises a resistor in series with the first diode.

* * * * *